United States Patent
Sanese et al.

(10) Patent No.: US 10,305,414 B2
(45) Date of Patent: May 28, 2019

(54) SOLAR COLLECTION ASSEMBLY AND METHOD

(71) Applicant: ASM IP Holdings, LLC, Columbus, OH (US)

(72) Inventors: Christopher N. Sanese, Columbus, OH (US); Jerry K. Mueller, Jr., Columbus, OH (US)

(73) Assignee: ASM IP Holdings LLC, Columbus, OH (US)

( * ) Notice: Subject to any disclaimer, the term of this patent is extended or adjusted under 35 U.S.C. 154(b) by 33 days.

(21) Appl. No.: 14/983,848

(22) Filed: Dec. 30, 2015

(65) Prior Publication Data
US 2017/0194893 A1  Jul. 6, 2017

(51) Int. Cl.
| | | |
|---|---|---|
| *F03D 9/00* | (2016.01) | |
| *H02S 10/12* | (2014.01) | |
| *H02J 7/35* | (2006.01) | |
| *H01L 31/054* | (2014.01) | |
| *H01L 31/05* | (2014.01) | |
| *H02S 40/42* | (2014.01) | |
| *H02S 40/22* | (2014.01) | |
| *F03D 9/25* | (2016.01) | |

(52) U.S. Cl.
CPC ............. *H02S 10/12* (2014.12); *F03D 9/007* (2013.01); *F03D 9/25* (2016.05); *H01L 31/0508* (2013.01); *H01L 31/0547* (2014.12); *H02J 7/35* (2013.01); *H02S 40/22* (2014.12); *H02S 40/425* (2014.12); *Y02E 10/52* (2013.01); *Y02E 10/725* (2013.01)

(58) Field of Classification Search
CPC .......... H02S 10/12; H02S 40/22; F03D 9/002; F03D 9/007
USPC ............... 290/44, 55, 1 R; 60/641.8, 641.11, 60/641.12, 641.15; 126/617; 136/259
See application file for complete search history.

(56) References Cited

U.S. PATENT DOCUMENTS

| | | | | |
|---|---|---|---|---|
| 3,321,012 A | * | 5/1967 | Hervey | F24J 2/07 |
| | | | | 126/684 |
| 4,074,678 A | * | 2/1978 | Posnansky | F24J 2/0488 |
| | | | | 126/652 |
| 4,353,212 A | * | 10/1982 | Adler | B64G 1/421 |
| | | | | 290/1 R |

(Continued)

FOREIGN PATENT DOCUMENTS

| | | | | | |
|---|---|---|---|---|---|
| FR | | 2574131 A1 | * | 6/1986 | ............. F03D 9/007 |
| UA | WO | 2015/088370 A1 | * | 6/2015 | |
| UA | WO | 2016/133484 A1 | * | 8/2016 | ............... F03G 6/06 |

*Primary Examiner* — Julio C. Gonzalez
(74) *Attorney, Agent, or Firm* — Mueller Law, LLC; Jerry K. Mueller, Jr.

(57) ABSTRACT

A solar collection assembly for collection of incident solar energy and generation of electricity includes a central vertically oriented support column carrying a solar collection assembly of one or more dual faced solar receptor assemblies. Each solar receptor assembly has an upper solar receptor surface and a lower solar receptor surface. A rotatable solar collector reflective assembly surrounds the central vertically oriented support column and is oriented to reflect incident solar energy onto the solar collection assembly. Sails are attached to the outside of the rotatable solar collector reflective assembly for additional generation of electricity by rotation of the rotatable solar collector reflective assembly from wind energy.

11 Claims, 5 Drawing Sheets

(56) References Cited

U.S. PATENT DOCUMENTS

| | | | | |
|---|---|---|---|---|
| 4,369,629 A * | 1/1983 | Lockwood | F03D 9/006 | 126/247 |
| 4,455,833 A * | 6/1984 | Tiboldi | F03D 9/007 | 126/561 |
| 5,275,643 A * | 1/1994 | Usui | E03B 3/28 | 290/55 |
| 8,710,350 B2 * | 4/2014 | Shufflebotham | F03D 9/007 | 136/244 |
| 8,739,533 B2 * | 6/2014 | Yogev | F01D 1/026 | 290/44 |
| 2008/0047270 A1 * | 2/2008 | Gilbert | F03D 3/005 | 60/641.12 |
| 2008/0150290 A1 * | 6/2008 | Fein | B60K 16/00 | 290/55 |
| 2009/0074577 A1 * | 3/2009 | Semov | F03D 3/02 | 416/132 B |
| 2009/0261595 A1 * | 10/2009 | Poo | F03D 3/02 | 290/55 |
| 2010/0183443 A1 * | 7/2010 | Thorne | F03D 9/007 | 416/146 R |
| 2011/0089698 A1 * | 4/2011 | Ahmadi | F03D 9/007 | 290/55 |
| 2013/0106193 A1 * | 5/2013 | Bryson | F03D 9/007 | 307/73 |
| 2013/0264829 A1 * | 10/2013 | Jordan, Sr. | F03D 9/007 | 290/55 |
| 2014/0265598 A1 * | 9/2014 | Isabella | F03D 9/007 | 307/72 |
| 2015/0068586 A1 * | 3/2015 | Willis | H01L 31/048 | 136/246 |
| 2015/0130398 A1 * | 5/2015 | Sanese | H02J 7/35 | 320/101 |
| 2015/0308409 A1 * | 10/2015 | Patel | F03D 9/002 | 290/50 |
| 2015/0311858 A1 * | 10/2015 | Vander Mey | F24J 2/10 | 136/246 |

* cited by examiner

SOLAR COLLECTION ASSEMBLY AND METHOD

CROSS-REFERENCE TO RELATED APPLICATIONS

This application is cross-referenced to commonly-owned application Ser. No. 14/535,350 filed on Nov. 7, 2014, now U.S. Pat. No. 9,391,473.

STATEMENT REGARDING FEDERALLY SPONSORED RESEARCH

Not applicable.

BACKGROUND

The present disclosure relates to solar collectors and more particularly to an improved solar collection system.

The amount of energy from the sun that falls on Earth's surface is enormous. All the energy stored in Earth's reserves of coal, oil, and natural gas is matched by the energy from just 20 days of sunshine. Outside Earth's atmosphere, the sun's energy contains about 1,300 watts per square meter. About one-third of this light is reflected back into space, and the atmosphere absorbs some (in part causing winds to blow). By the time it reaches Earth's surface, the energy in sunlight has fallen to about 1,000 watts per square meter at noon on a cloudless day. Averaged over the entire surface of the planet, 24 hours per day for a year, each square meter collects the approximate energy equivalent of almost a barrel of oil each year, or 4.2 kilowatt-hours of energy every day. Deserts, with very dry air and little cloud cover, receive the most sun—more than six kilowatt-hours per day per square meter. Northern climates, such as Boston, get closer to 3.6 kilowatt-hours. Sunlight varies by season as well, with some areas receiving very little sunshine in the winter. Seattle in December, for example, gets only about 0.7 kilowatt-hours per day.

It also should be noted that these figures represent the maximum available solar energy that can be captured and used, but solar collectors capture only a portion of this, depending on their efficiency. For example, a one square meter solar electric panel with an efficiency of 15 percent would produce about one kilowatt-hour of electricity per day in Arizona. Solar collectors are limited by their collection are; thus, making large fields of them necessary for achieving truly commercial scale electrical generation.

The present disclosure addresses this limitation and more.

BRIEF SUMMARY

A solar collection assembly for collection of incident solar energy and generation of electricity includes a central vertically oriented support column carrying a solar collection assembly of one or more dual faced solar receptor assemblies. Each solar receptor assembly has an upper solar receptor surface and a lower solar receptor surface. A rotatable solar collector reflective assembly surrounds the central vertically oriented support column and is oriented to reflect incident solar energy onto the solar collection assembly. Sails or wings are attached to the outside of the rotatable solar collector reflective assembly for additional generation of electricity by rotation of the rotatable solar collector reflective assembly from wind energy.

A method for generating electricity from a solar collection assembly starts with providing the disclosed solar collection assembly. Next, the solar module collection assembly is exposed to solar energy (the sun). The rotatable solar collector reflective assembly also is exposed to wind energy for its rotation for generating electricity. The solar energy generated thereby is One or more of stored or used.

Another solar collection assembly for collection of incident solar energy and generation of electricity includes a central vertically oriented support column carrying a solar collection assembly of one or more dual faced solar receptor assemblies. Each solar receptor assembly has an upper solar receptor surface and a lower solar receptor surface. A holographic solar collector reflective assembly surrounds the central vertically oriented support column and is oriented to reflect incident solar energy onto the solar collection assembly.

BRIEF DESCRIPTION OF THE DRAWINGS

For a fuller understanding of the nature and advantages of the present method and process, reference should be had to the following detailed description taken in connection with the accompanying drawings, in which.

The drawings will be described in greater detail below.

DETAILED DESCRIPTION

A feature of the disclosed solar collector assemblies resides in the multi-faceted solar receptors that accept solar energy both on their top surfaces and their lower surfaces; thus, increasing the area upon which solar energy strikes without consuming additional acreage. This is possible by orienting the multi-faceted solar receptors with respect to a parabolic or other designed surface that also reflects the incident solar energy to the lower surfaces of the dual faced solar receptors. Solar energy, then, strikes both the upper surface and the lower surface of the multi-faceted solar receptor assemblies. A uniqueness in design of the disclosed solar module resides additionally in making the parabolic reflector wind rotatable.

The basic components of the solar module are as follows:
A. vertical support column clad with solar receptor;
B. multi-faceted solar receptor assemblies;
C. rotating parabolic solar reflective assembly;
D. optional mesh portal for use with water filtration reservoir;
E. system display; and
F. circuitry, and battery and/or inverter components.

Figure 1:
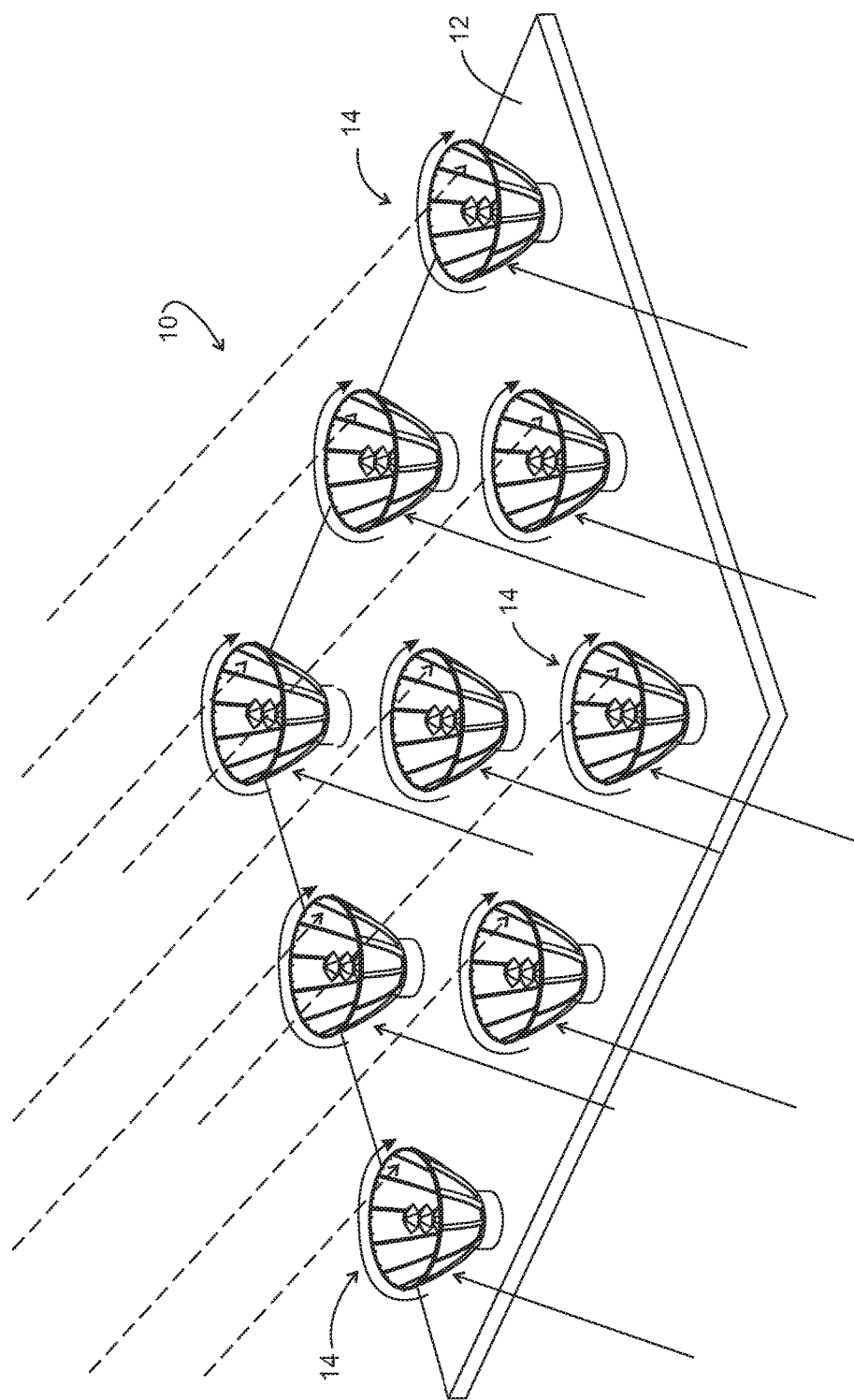
FIG. 1 is an isometric view of a field of the disclosed rotating parabolic solar collector assemblies.
Figure 2:
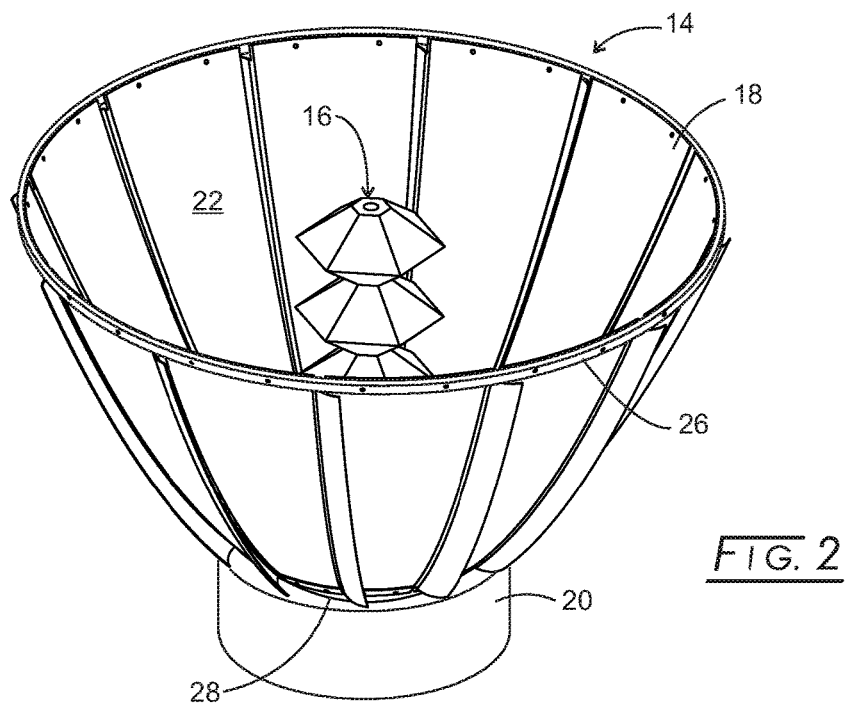
FIG. 2 is an isometric view of one of the rotating parabolic solar collector assemblies of FIG. 1.

Referring now to FIG. 1 is a field, 10, of the disclosed solar module assemblies with rotating parabolic reflector assembly. While 9 such solar module assemblies are illustrated for field 10, the number could greater or fewer. The dashed arrows represent solar energy impacting field 10 while the solid arrows represent the prevailing wind experienced by field 10. The circular arrows around each solar module assembly represent the direction of rotation for each assembly caused by the prevailing wind. Energy, then, is generated by a combination of solar radiation and wind. Field 10 is mounted on a single base, 12, which may be concrete, pavement, or other material.

Referring now to FIGS. 2-5, one of the solar module assemblies, 14, in field 10 is illustrated. Segmented solar module assembly 14 includes a central solar receptor tower, 16, a rotating solar reflector assembly, 18, and a housing or base, 20, for a gear assembly (not seen). The design of rotating segmented solar reflector assembly 14 is one of choice so long as its inner surface, 22, is parabolic in shape to maximize solar reflection onto solar receptor tower 16; although alternative curvilinear or other geometric shapes likely will find use in constructing the solar module disclosed herein. Depending upon the orientation and design of solar receptor tower 16, the number of towers, and their orientation, different shaped inner surfaces may be appropriate for solar collector assembly 14. Materials of construction for solar collector assembly 12 will be appropriate for durability, resistance to weathering, and like factors, bearing in mind that solar collector assembly 12 also provides support for solar receptor tower 14. Appropriate materials, then, include, for example, metals, ceramics, glasses, plastics, combinations thereof, and the like, optionally laminated and optionally with special finishes. Regardless of material of construction, solar collector assembly 18 has a specular interior surface. In fact, the solar collector assembly even may be inflatable. Since solar collector assembly 18 is segmented, each segment has a specular inner surface and the assembly of such segments results in a curvilinear inner surface that may be parabolic in shape.

Figure 3:
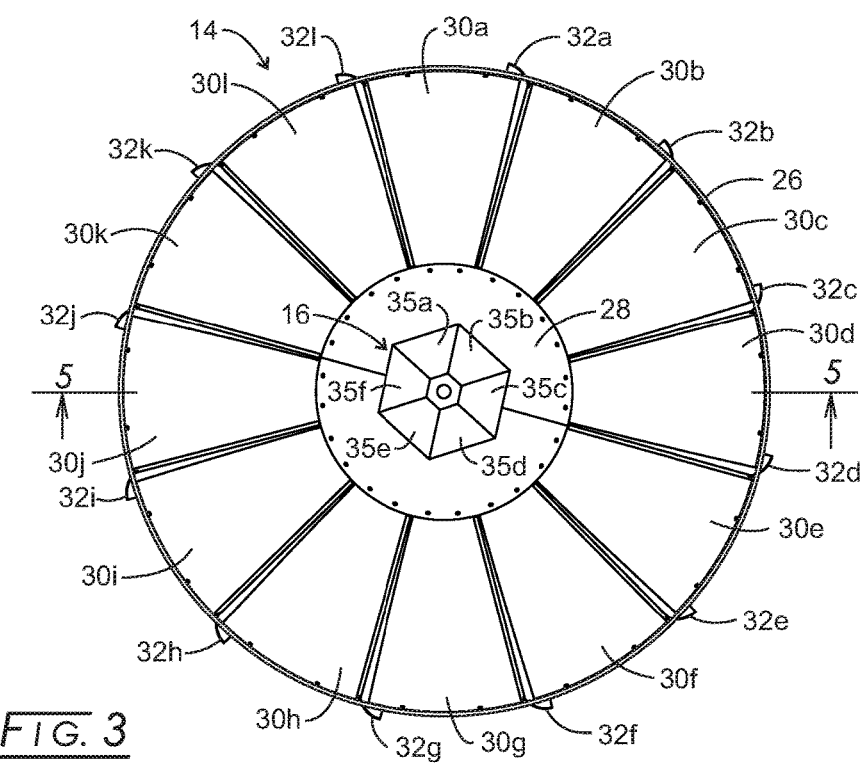
FIG. 3 is a top view of the rotating parabolic solar collector of FIG. 2.
Figure 4:
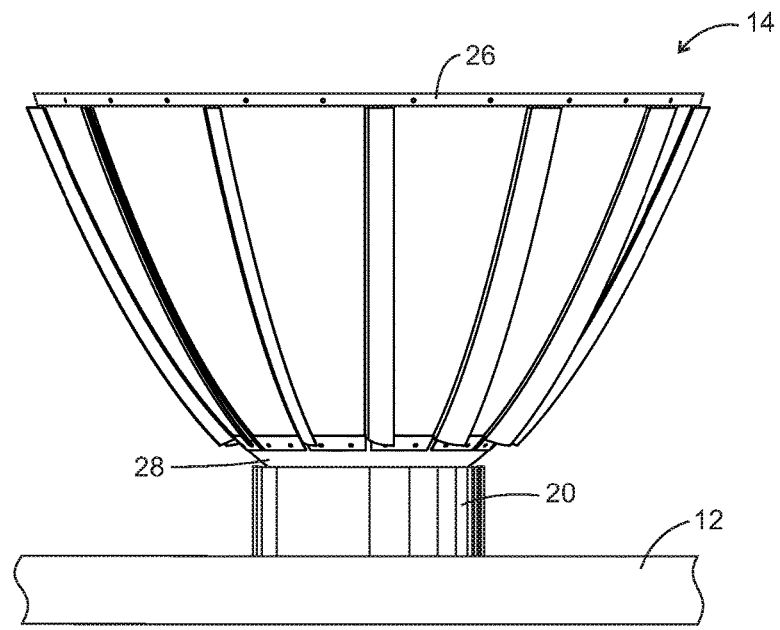
FIG. 4 is a side view of the rotating parabolic solar collector assembly of FIG. 3.
Figure 5:
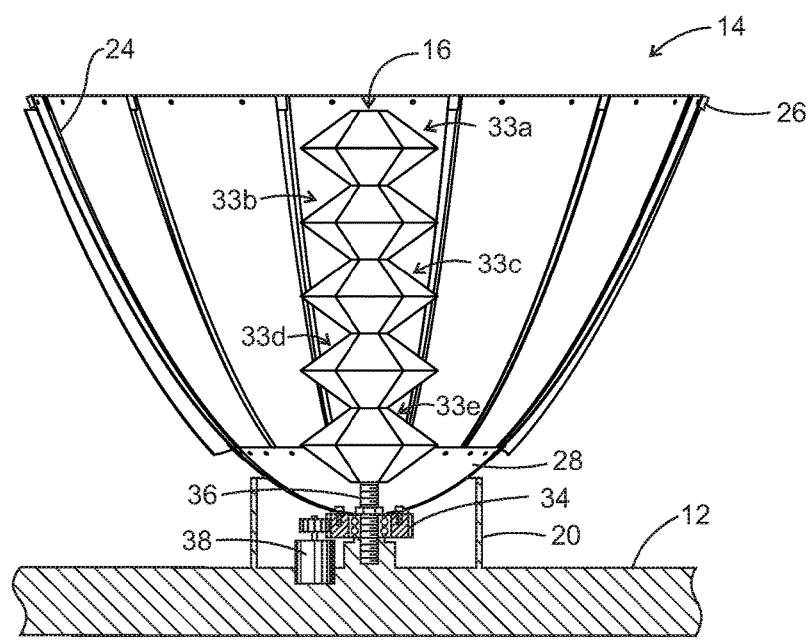
FIG. 5 is a cross-sectional view taken along line 5-5 of FIG. 3.

FIG. 5 shows central solar receptor tower 16 carrying 5 solar receptor assemblies, 33a-33e, each such solar receptor assembly carrying 6 (see FIG. 3) wedge-shaped supports, 35a-35f (only the top such support being labeled for illustration in FIG. 3). Each surface of the wedge-shaped supports 35a-35f having a solar receptor affixed thereto.

Figure 6:
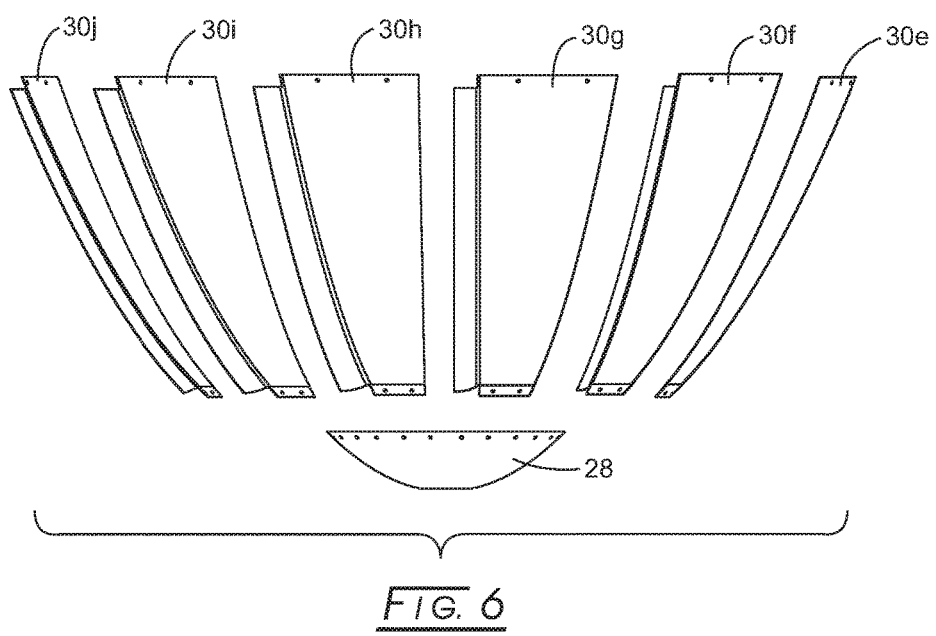
FIG. 6 is a side view of the parabolic reflector components used to assemble the parabolic reflector.

The interior surface of segmented solar collector assembly 18 will be specular so as to reflect solar radiation (dashed arrows in FIG. 1) incident thereupon. Segmented solar collector assembly 18 can be inherently specular, such as, for example, by being made from metal, such as aluminum, or can have a specular coating, 24, (see FIG. 5) applied to it. Such mirrored coating 24 is present on each segment. While such segments or panels can be horizontal or vertical in orientation and held in place by hardware (e.g., nuts and bolts), vertical such segments are illustrated in the drawings. Also, while 12 such segments, 30a-30l, are illustrated in the drawings (see FIG. 3), the number of segments or panels can be greater or lesser in number. Each segment is connected to an upper ring, 26, and to a lower cup, 28, as best seen in FIGS. 5 and 6.

With a specular lining, the structure supporting the specular lining can be made from a variety of durable materials, such as, for example, concrete, wood, metal, plastic, ceramic, combinations, and the like. Use of a specular lining may make maintenance and replacement of the specular lining, especially with for the use of segments or panels panels, easier and more cost effective. Of course, remote monitoring of the solar collector assembly or more likely an array of solar collector assemblies may find advantage.

In order for segmented solar collector assembly 18 to rotate, some type of wind interference needs to be present. In FIGS. 1-5, a curvilinear wing is affixed to each segment 30a-30l, as illustrated by wings, 32a-32l, affixed to segments 30a-30l, respectively. Of course the number of wings could be greater or lesser in number than the number of segments. Each wing is interrupts for flow of wind, which causes solar collector assembly 18 to rotate, since solar collector assembly 18 is mounted on a gear, 34, affixed to a shaft, 36, mounted within base 20, as illustrated in FIG. 5. Gear 34 in turn meshes with a geared inverter, 38, for generation of electricity. Of course, other methods for converting the generated solar and mechanical energy could be envisioned and are within the scope of the present disclosure.

Figure 7:
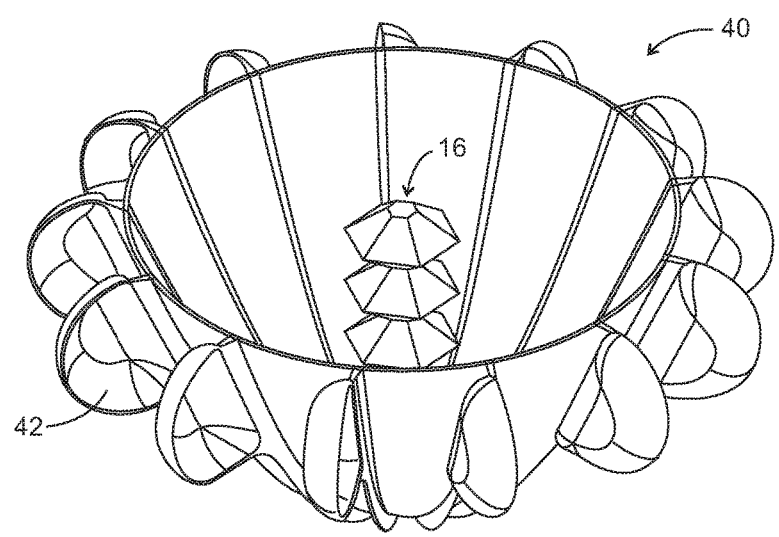
FIG. 7 is an isometric view of an alternative embodiment of the rotating parabolic solar collector assembly.

Referring now to FIG. 7, an alternative rotating solar assembly, 40, is illustrated. It will be observed that each segment now has a differently designed wing affixed to its outside, as illustrated by a wing, 42. Wing 42 is cup shaped for capturing the wind and causing solar assembly 40 to rotate for mechanically generating electricity in addition to the solar generation of electricity by solar receptor tower 16.

Since solar collector assembly 18 will be located in the sun and its interior surface will be specular or made from material providing a specular surface, it is reasonable that solar collector assembly 12 will become hot. Commonly-owned application Ser. No. 14/535,350, now U.S. Pat. No. 9,391,473, addresses the heat issue by proposing to use a fluid conduit(s) formed into the interior of walls forming the solar collector assembly. Running water or other fluid flowing within the fluid conduits remove excess heat. Such fluid conduits could be used in the present design at the expense of adding extra weight.

Electrical leads and electrical circuitry and connections are not illustrated in the drawings, but are to be provided in conventional fashion. Since some configurations of the disclosed solar module will have the parabolic mirror exposed to rain, provision can be made around the juncture of the central column and the mirror to place a mesh for filtering and permitting rain to flow therethrough and into a base reservoir for its collection and reuse. Of course, the disclosed solar module will have a readout display for maintenance and collection of data. Provision of an inverter, battery, and other components for collection of the generated electricity will be provided as needed.

Figure 8:
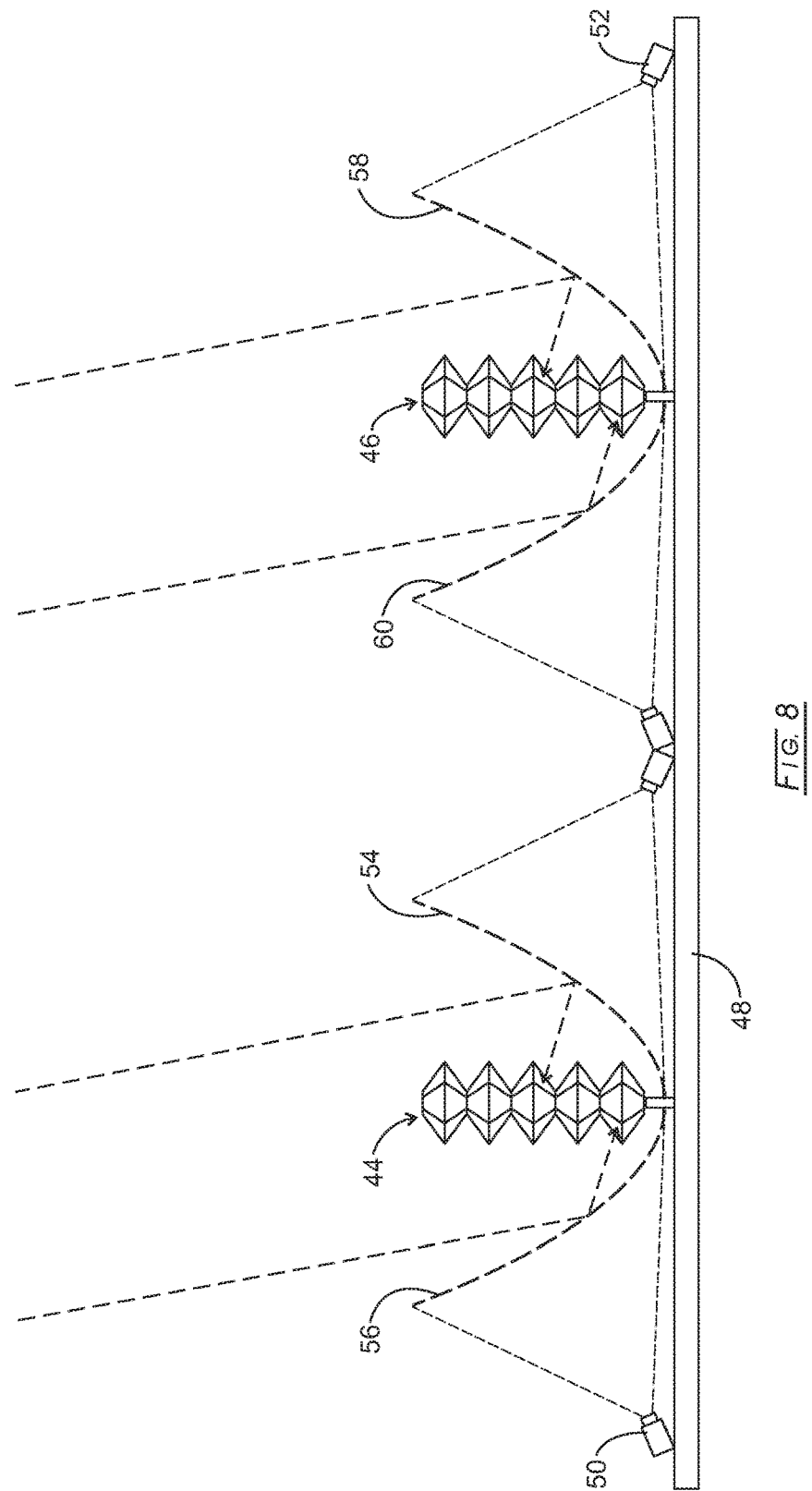
FIG. 8 is yet another embodiment of a parabolic solar collector assembly where the parabolic reflector is generated holographically.

In FIG. 8, central solar receptor towers, 44 and 46, are mounted to a base or pad, 48, much as has been described above. In this embodiment, however, a pair of projectors, 50 and 52, project holographic parabolic mirror images, 54, 56, 58 and 60, that surround central solar receptor towers 44 and 46 and reflect incident solar radiation/energy, indicated by the dashed lines, onto the solar receptive towers for generation of electricity, as has been described above. In this embodiment, rotation of the holographic reflectors is not possible or needed. The same is true for the need of cooling of the parabolic reflectors, since no cooling is needed. Of course, the number of holographic projectors could be greater or less than the number illustrated in FIG. 8.

While the device and method have been described with reference to various embodiments, those skilled in the art will understand that various changes may be made and equivalents may be substituted for elements thereof without departing from the scope and essence of the disclosure. In addition, many modifications may be made to adapt a particular situation or material to the teachings of the disclosure without departing from the essential scope thereof. Therefore, it is intended that the disclosure not be limited to the particular embodiments disclosed, but that the disclosure will include all embodiments falling within the scope of the appended claims. All citations referred herein are expressly incorporated herein by reference.

We claim:

1. A solar collection assembly for collection of incident solar energy and generation of electricity, which comprises:
   (a) a central vertically oriented support column;
   (b) a solar collection assembly comprising one or more dual faced solar receptor assemblies, each solar receptor assembly having an upper solar receptor surface and a lower solar receptor surface, the solar collection assembly carried by the central vertically oriented support column;
   (c) a rotatable solar collector reflective assembly surrounding the central vertically oriented support column and oriented to reflect incident solar energy onto the solar collection assembly; and
   (d) sails attached to the outside of the rotatable solar collector reflective assembly for additional generation of electricity by rotation of the rotatable solar collector reflective assembly from wind energy.

2. The solar module collection assembly of claim 1, wherein each solar receptor assembly comprises a wedge-shaped support having an upper surface and a lower surface, each upper and lower surface having a solar receptor affixed thereto.

3. The solar module collection assembly of claim 1, wherein the central vertically oriented support column has solar receptors affixed thereto.

4. The solar module collection assembly of claim 1, wherein each solar receptor is in series, parallel, or a combination electrical connection.

5. The solar module collection assembly of claim 1, wherein the rotatable solar collector reflective assembly is attached to a gear for rotation of the rotatable solar collector reflective assembly.

6. An array of solar module collection assemblies of claim 1.

7. A method for generating electricity from a solar collection assembly, which comprises the steps of:
   (A) providing a solar module collection assembly comprising:
      (a) a central vertically oriented support column;
      (b) a solar collection assembly comprising one or more dual faced solar receptor assemblies, each solar receptor assembly having an upper solar receptor surface and a lower solar receptor surface, the solar collection assembly carried by the central vertically oriented support column;
      (c) a solar collector reflective assembly surrounding the central vertically oriented support column and oriented to reflect incident solar energy onto the solar collection assembly; and
      (d) sails attached to the outside of the rotatable solar collector reflective assembly for additional generation of electricity by rotation of the rotatable solar collector reflective assembly from wind energy;
   (B) exposing the provided solar module collection assembly to solar energy; and
   (C) exposing the rotatable solar collector reflective assembly to wind energy for its rotation of the rotatable solar collector reflective assembly for generating electricity; and
   (D) one or more of storing or using the solar energy generated thereby.

8. The method of claim 7, wherein each solar receptor assembly is formed from a wedge-shaped support having an upper surface and a lower surface, and affixing a solar receptor to each the upper and lower surface.

9. The method of claim 7, further including the step of affixing solar receptors to the central vertically oriented support column.

10. The method of claim 7, further including the step of electrically connecting each solar receptor in one or more of series, parallel, or a combination.

11. The solar module collection assembly of claim 7, further including the step of providing an array thereof.

* * * * *